United States Patent
Kato et al.

(10) Patent No.: US 10,096,356 B2
(45) Date of Patent: Oct. 9, 2018

(54) METHOD OF OPERATION OF NON-VOLATILE MEMORY DEVICE

(71) Applicant: TOSHIBA MEMORY CORPORATION, Minato-ku, Tokyo (JP)

(72) Inventors: Koji Kato, Yokohama Kanagawa (JP); Tomonori Kurosawa, Zama Kanagawa (JP); Takeshi Nakano, Kawasaki Kanagawa (JP); Tsukasa Kobayashi, Machida Tokyo (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 43 days.

(21) Appl. No.: 15/065,351

(22) Filed: Mar. 9, 2016

(65) Prior Publication Data

US 2017/0162257 A1 Jun. 8, 2017

Related U.S. Application Data

(60) Provisional application No. 62/263,430, filed on Dec. 4, 2015.

(51) Int. Cl.
*G11C 11/56* (2006.01)
*G11C 16/04* (2006.01)
*G11C 16/10* (2006.01)

(52) U.S. Cl.
CPC ...... *G11C 11/5628* (2013.01); *G11C 16/0483* (2013.01); *G11C 16/10* (2013.01)

(58) Field of Classification Search
CPC .................................................. G11C 16/0483
See application file for complete search history.

(56) References Cited

U.S. PATENT DOCUMENTS

| | | | | |
|---|---|---|---|---|
| 6,751,124 B2* | 6/2004 | Lee | ........................ | G11C 16/10 365/185.11 |
| 7,054,195 B2* | 5/2006 | Matsunaga | ............... | 365/185.11 |
| 7,489,546 B2* | 2/2009 | Roohparvar | ........ | G11C 16/0483 365/185.05 |
| 7,656,708 B2* | 2/2010 | Hong | ........................ | G11C 7/12 365/185.11 |
| 7,663,932 B2* | 2/2010 | Hamada | ................. | G11C 16/34 365/185.25 |
| 7,768,837 B2* | 8/2010 | Choi | ....................... | G11C 16/24 365/185.23 |
| 7,782,673 B2* | 8/2010 | Maejima | ............. | G11C 11/5642 365/185.15 |

(Continued)

FOREIGN PATENT DOCUMENTS

JP 2001273776 A 10/2001
JP 2005063633 A 3/2005

*Primary Examiner* — Anthan Tran
*Assistant Examiner* — Mushfique Siddique
(74) *Attorney, Agent, or Firm* — Holtz, Holtz & Volek PC

(57) ABSTRACT

According to one embodiment, a memory device includes a first memory cell; a second memory cell; a first bit line connected to the first memory cell; a second bit line connected to the second memory cell; a first word line connected to the first memory cell and the second memory cell; a first circuit configured to control a connection between the first bit line and a first node; and a second circuit configured to control a connection between the second bit line and the first node.

24 Claims, 12 Drawing Sheets

(56) References Cited

U.S. PATENT DOCUMENTS

| | | | | |
|---|---|---|---|---|
| 8,503,248 B2* | 8/2013 | Otsuka | G11C 16/0483 | 365/185.11 |
| 8,625,349 B2* | 1/2014 | Kutsukake | G11C 16/0483 | 365/185.01 |
| 8,737,132 B2* | 5/2014 | Nguyen | G11C 11/5628 | 365/185.03 |
| 8,760,930 B1* | 6/2014 | Kushnarenko | G11C 16/0491 | 365/185.05 |
| 9,390,808 B1* | 7/2016 | Kato | G11C 16/3445 | |
| 9,496,042 B1* | 11/2016 | Abiko | G11C 16/10 | |
| 9,570,180 B2* | 2/2017 | Maejima | G11C 16/10 | |
| 9,659,656 B2* | 5/2017 | Nguyen | G11C 16/0483 | |
| 9,947,407 B2* | 4/2018 | Nguyen | G11C 16/0483 | |
| 2007/0002628 A1* | 1/2007 | Kim | G11C 11/5642 | 365/185.17 |
| 2007/0035999 A1* | 2/2007 | Kim | G11C 7/1021 | 365/185.12 |
| 2007/0297233 A1* | 12/2007 | Maejima | G11C 16/0483 | 365/185.17 |
| 2009/0067236 A1* | 3/2009 | Isobe | G11C 11/5642 | 365/185.03 |
| 2009/0268526 A1* | 10/2009 | Nakano | G11C 16/08 | 365/185.18 |
| 2009/0316479 A1* | 12/2009 | Shibata | G11C 11/5628 | 365/185.03 |
| 2009/0316494 A1* | 12/2009 | Uehara | G11C 7/1006 | 365/189.05 |
| 2010/0124109 A1* | 5/2010 | Honma | G11C 11/5628 | 365/185.03 |
| 2010/0214837 A1* | 8/2010 | Sako | G11C 5/147 | 365/185.03 |
| 2010/0232229 A1* | 9/2010 | Ogawa | G11C 16/06 | 365/185.21 |
| 2010/0329017 A1* | 12/2010 | Nakano | G11C 16/0483 | 365/185.18 |
| 2011/0051517 A1* | 3/2011 | Mui | G11C 11/5628 | 365/185.17 |
| 2011/0157997 A1* | 6/2011 | Kamigaichi | G11C 11/5628 | 365/185.22 |
| 2012/0063224 A1* | 3/2012 | Edahiro | G11C 11/5628 | 365/185.03 |
| 2012/0092931 A1* | 4/2012 | Edahiro | G11C 16/0483 | 365/185.17 |
| 2012/0163112 A1* | 6/2012 | Shibata | G11C 5/147 | 365/226 |
| 2012/0201083 A1* | 8/2012 | Fujiu | G11C 11/5628 | 365/185.19 |
| 2012/0206977 A1* | 8/2012 | Shibata | G11C 16/10 | 365/185.22 |
| 2012/0307562 A1* | 12/2012 | Maejima | G11C 16/0483 | 365/185.18 |
| 2013/0077405 A1* | 3/2013 | Kato | G11C 11/5642 | 365/185.18 |
| 2013/0155778 A1* | 6/2013 | Sakaguchi | G11C 16/10 | 365/185.25 |
| 2013/0163338 A1* | 6/2013 | Kato | G11C 16/16 | 365/185.17 |
| 2013/0235657 A1* | 9/2013 | Honma | G11C 16/3427 | 365/185.02 |
| 2013/0242660 A1* | 9/2013 | Kato | G11C 16/10 | 365/185.17 |
| 2013/0279255 A1* | 10/2013 | Kamata | G11C 16/26 | 365/185.11 |
| 2014/0043907 A1* | 2/2014 | Fujimura | G11C 16/26 | 365/185.11 |
| 2014/0233320 A1* | 8/2014 | Sakaguchi | G11C 16/26 | 365/185.21 |
| 2014/0247671 A1* | 9/2014 | Ito | G11C 16/26 | 365/185.23 |
| 2014/0269094 A1* | 9/2014 | Maeda | G11C 16/26 | 365/185.21 |
| 2015/0262670 A1* | 9/2015 | Hosono | G11C 16/0483 | 365/185.18 |
| 2015/0302920 A1* | 10/2015 | Shibata | G11C 11/5635 | 365/185.03 |
| 2016/0055911 A1* | 2/2016 | Nguyen | G11C 16/10 | 365/185.17 |
| 2016/0071593 A1* | 3/2016 | Hashimoto | G11C 16/08 | 365/185.33 |
| 2016/0078959 A1* | 3/2016 | Bushnaq | G11C 16/32 | 365/185.21 |
| 2016/0189770 A1* | 6/2016 | Abe | G11C 11/5642 | 365/185.03 |
| 2016/0240247 A1* | 8/2016 | Shibata | G11C 11/5635 | |
| 2016/0240264 A1* | 8/2016 | Hosono | G11C 16/3459 | |
| 2016/0247573 A1* | 8/2016 | Maejima | G11C 16/10 | |
| 2016/0267991 A1* | 9/2016 | Hashimoto | G11C 16/10 | |
| 2017/0062054 A1* | 3/2017 | Maeda | G11C 16/10 | |
| 2017/0062062 A1* | 3/2017 | Tanabe | G11C 16/26 | |
| 2017/0069394 A1* | 3/2017 | Maejima | G11C 16/26 | |
| 2017/0075595 A1* | 3/2017 | Maejima | G06F 1/32 | |
| 2017/0076813 A1* | 3/2017 | Kato | G11C 16/3459 | |
| 2017/0117047 A1* | 4/2017 | Maejima | G11C 16/10 | |
| 2017/0148518 A1* | 5/2017 | Kadowaki | G11C 16/10 | |
| 2017/0256317 A1* | 9/2017 | Nguyen | G11C 16/10 | |
| 2017/0271023 A1* | 9/2017 | Maejima | G11C 11/5628 | |

* cited by examiner

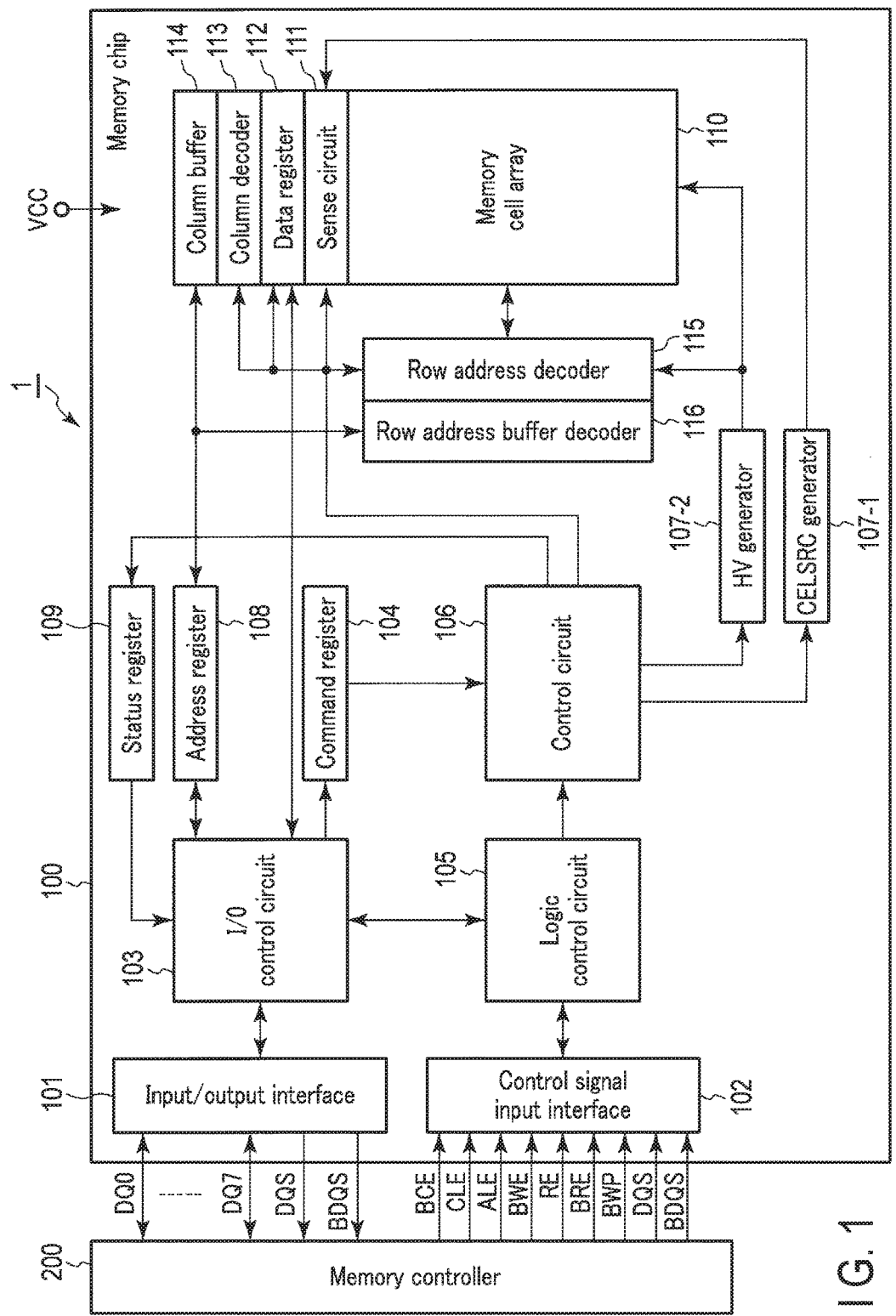
F I G. 1

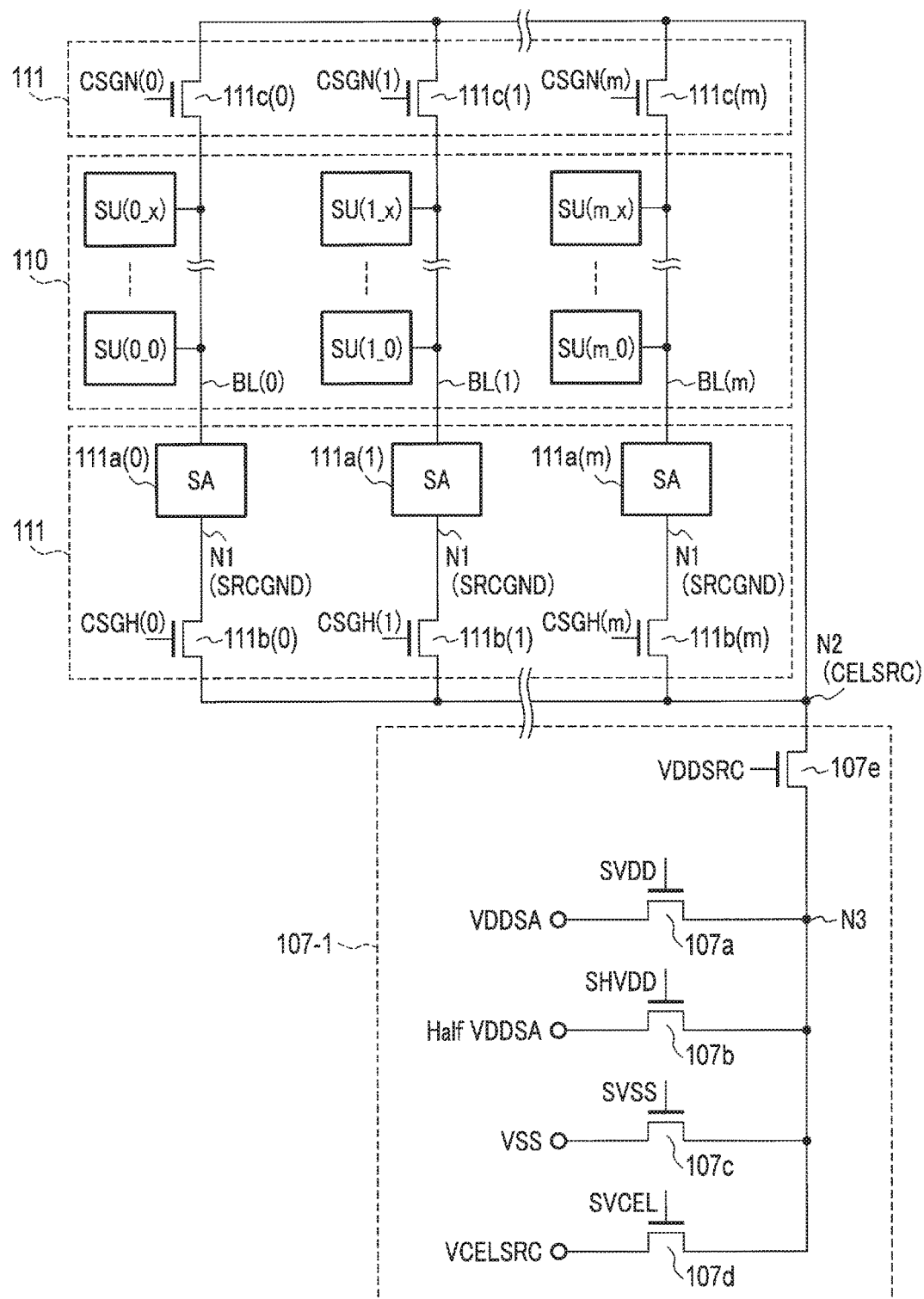
F I G. 2

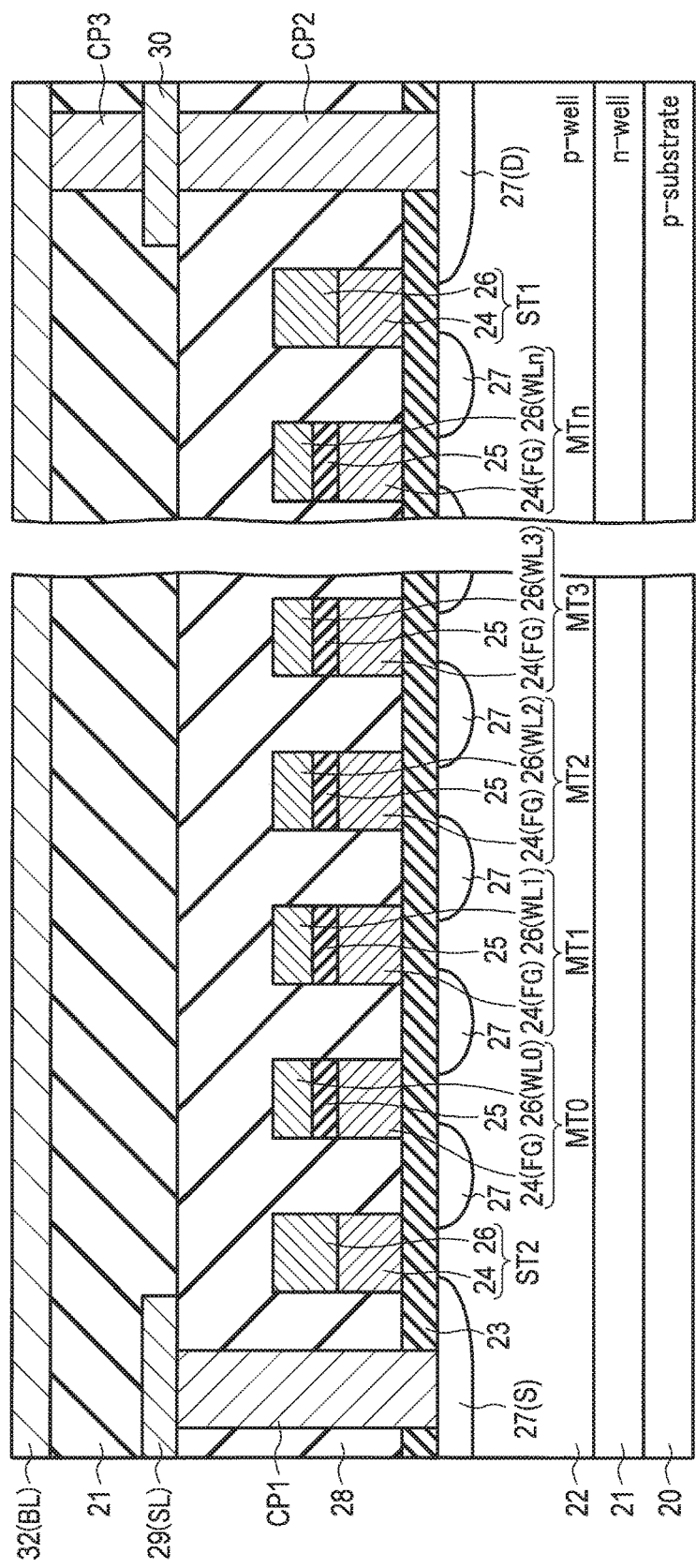
F I G. 5

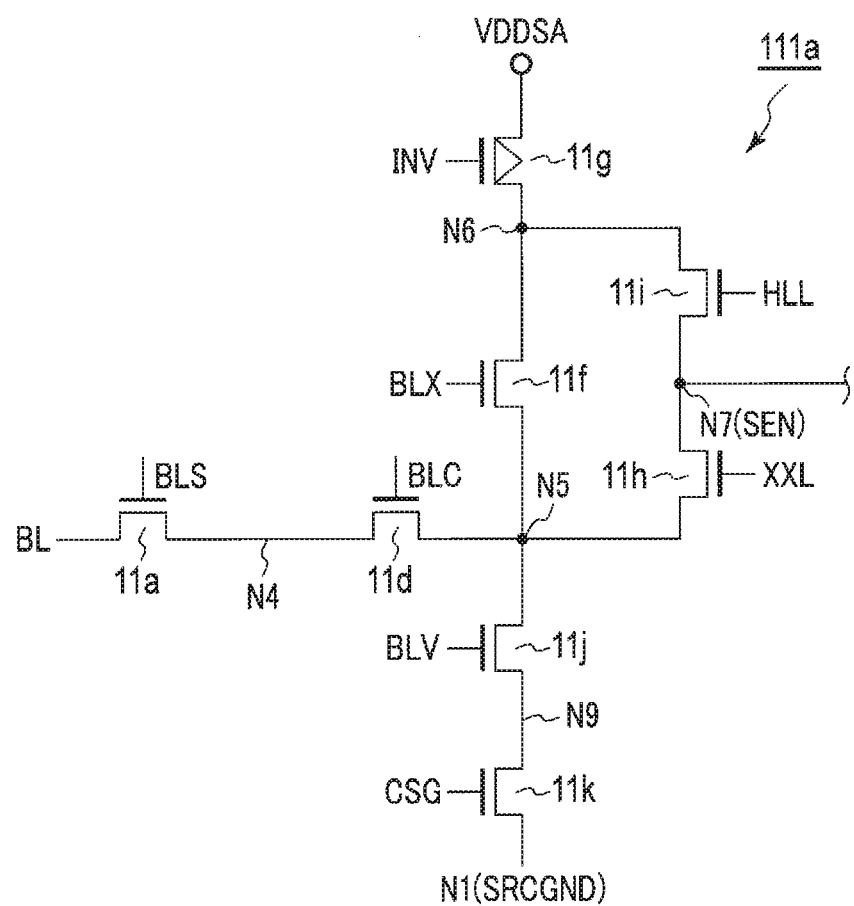
F I G. 9

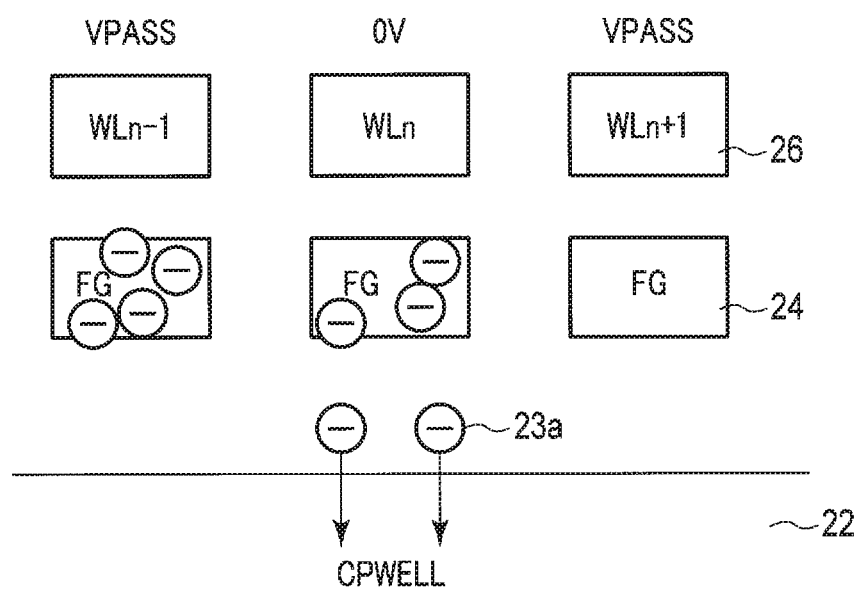
F I G. 12

METHOD OF OPERATION OF NON-VOLATILE MEMORY DEVICE

CROSS REFERENCE TO RELATED APPLICATIONS

This application claims the benefit of U.S. Provisional Application No. 62/263,430, filed Dec. 4, 2015, the entire contents of which are incorporated herein by reference.

FIELD

Embodiments relate to a memory device.

BACKGROUND

At present, with an increase in application use of non-volatile semiconductor memory devices (memories), the operation speed has been increasing.

BRIEF DESCRIPTION OF THE DRAWINGS

FIG. 1 is a block diagram illustrating the outline of a semiconductor memory device according to a first embodiment.

FIG. 2 is a circuit diagram illustrating a memory cell array, as well as peripheral parts thereof, of the semiconductor memory device according to the first embodiment.

FIG. 5 is a cross-sectional view of the memory cell array of the semiconductor memory device according to the first embodiment.

FIG. 9 is a circuit diagram illustrating a sense amplifier of a semiconductor memory device according to a modification of the first embodiment.

FIG. 12 is a cross-sectional view of a memory cell array of a semiconductor memory device at a time of a write operation.

DETAILED DESCRIPTION

Figure 3:
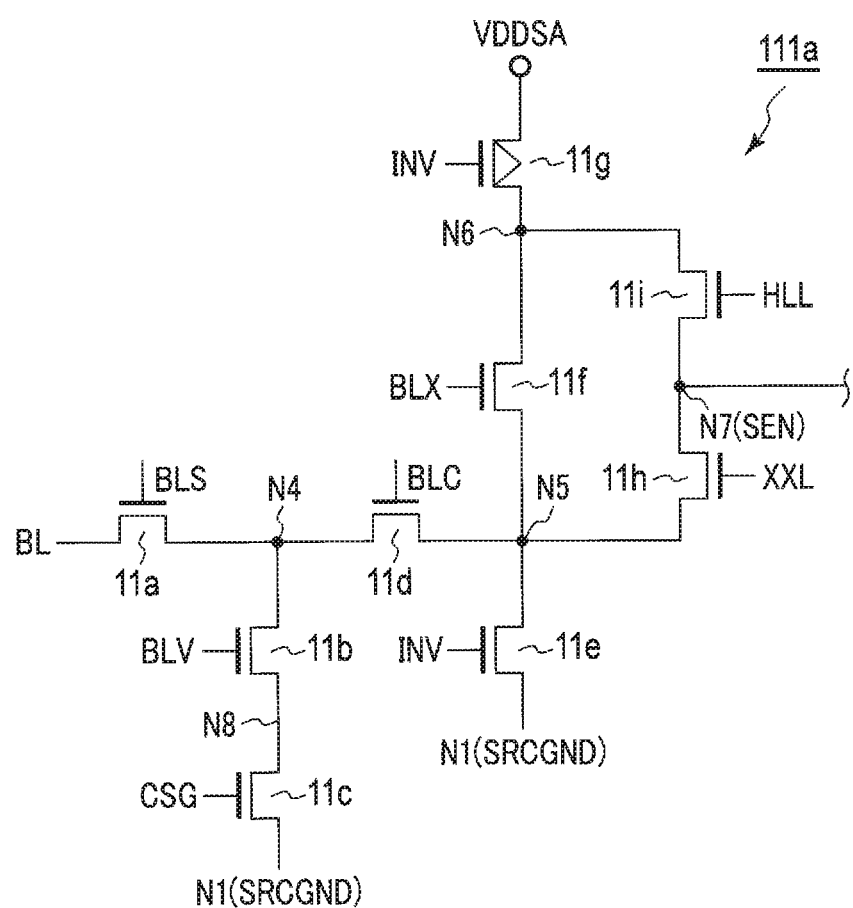
FIG. 3 is a circuit diagram illustrating a sense amplifier of the semiconductor memory device according to the first embodiment.

In general, according to one embodiment, a memory device includes a first memory cell; a second memory cell; a first bit line connected to the first memory cell; a second bit line connected to the second memory cell; a first word line connected to the first memory cell and the second memory cell; a first circuit configured to control a connection between the first bit line and a first node; and a second circuit configured to control a connection between the second bit line and the first node, wherein, at a time of writing data to the first memory cell, the memory device is configured: to apply a first voltage to the second bit line, to apply a second voltage, which is lower than the first voltage, to the first bit line, and to apply a third voltage, which is higher than the first voltage, to the first word line, and the memory device is configured, at a time of starting discharge of the first word line to a fourth voltage which is lower than the third voltage, after the third voltage was applied to the first word line, to turn on the first circuit and the second circuit and to apply a fifth voltage to the first node.

Hereinafter, embodiments will be described with reference to the accompanying drawings. In the description below, structural elements having substantially the same functions and structures are denoted by like reference signs. In addition, embodiments to be described below illustrate, by way of example, devices or methods for embodying technical concepts of the embodiments, and the technical concepts of the embodiments do not specifically restrict the material, shape, structure, arrangement, etc. of structural components to those described below. Various changes may be made in the technical concepts of the embodiments within the scope of the claims.

<1> First Embodiment

<1-1> Configuration

<1-1-1> Memory System

Referring to FIG. 1, a memory system including a semiconductor memory device according to the embodiment is described.

As illustrated in FIG. 1, a memory system 1 includes a memory chip (semiconductor memory device) 100 and a memory controller 200. For example, the memory chip 100 and memory controller 200 may be combined to constitute a single semiconductor device, which is, for instance, a memory card such as an SD™ card, or an SSD (solid state drive). The memory system 1 may be configured to further include a host device (not shown).

<1-1-2> Memory Controller

The memory controller 200 outputs a command, etc., which are necessary for the operation of the memory chip 100, to the memory chip 100. By outputting the command to the memory chip 100, the memory controller 200 executes data read from the memory chip 100, data write to the memory chip 100, or data erase of the memory chip 100.

<1-1-3> Memory Chip

Referring to FIG. 1, the memory chip 100 according to the embodiment is described.

The memory controller 200 and memory chip 100 are connected via an input/output interface 101 and a control signal input interface 102.

The input/output interface 101 generates data strobe signals DQS and BDQS (a complementary signal of DQS) in accordance with signals which are supplied from an input/output control circuit 103. The input/output interface 101 outputs the data strobe signals DQS and BDQS at a time of outputting data from data input/output lines (DQ0 to DQ7). In addition, the memory controller 200 receives data from the data input/output lines (DQ0 to DQ7) in accordance with the timing of the data strobe signals DQS and BDQS which the memory controller 200 receives from the input/output interface 101.

In addition, the input/output interface 101 includes, for example, a command input terminal and an address input terminal.

The control signal input interface 102 receives, from the memory controller 200, a chip enable signal BCE (Bar chip enable), a command latch enable signal CLE (Command latch enable), an address latch enable signal ALE (Address latch enable), a write enable signal BWE (Bar write enable), a read enable signal RE (Read enable), a read enable signal BRE (Bar read enable), a write protect signal BWP (Bar write protect), a data strobe signal DOS, and a data strobe signal BDQS.

The chip enable signal BCE is used as a select signal of the memory chip 100.

The command latch enable signal CLE is a signal which is used at a time of taking an operation command into a command register 104.

The address latch enable signal ALE is a signal which is used at a time of taking address information or input data into an address register 108 or a data register 112.

The write enable signal BWE is a signal for taking into the memory chip 100 a command, an address and data on the input/output interface 101.

The read enable signal RE is a signal which is used at a time of serially outputting data from the input/output interface 101. The read enable signal BRE is a complementary signal of the RE.

The write protect signal BWP is used in order to protect data from unexpectable erase or write, when an input signal is uncertain, such as when the memory chip 100 is powered on or powered off.

In addition, the memory chip 100 is provided with a VCC terminal for power supply. The VCC terminal supplies power supply voltage to the memory chip 100.

Although not illustrated in FIG. 1, the memory chip 100 is also provided with an R/B terminal for indicating an internal operation state of the memory chip 100, and a Vss/Vccq/Vssq terminal for power supply.

The input/output control circuit 103 outputs data, which was read from a memory cell array 110, to the memory controller 200 via the input/output interface 101. The input/output control circuit 103 receives, via the control signal input interface 102 and a logic control circuit 105, various commands of write, read, erase and status read, addresses, and write data.

The command register 104 outputs a command, which is input from the input/output control circuit 103, to a control circuit 106.

The logic control circuit 105 supplies a control signal, which is input via the control signal input interface 102, to the input/output control circuit 103 and control circuit 106.

The control circuit 106 controls a CELSRC power supply circuit (CELSRC generator) 107-1, a boost circuit (HV generator) 107-2, a sense circuit 111, a data register 112, a column decoder 113, a row address decoder 115, and a status register 109.

The control circuit 106 operates in accordance with a control circuit which is input from the logic control circuit 105, and a command which is input via the command register 104. The control circuit 106 supplies, at times of data program, verify, read and erase, desired voltages to the memory cell array 110, sense circuit 111 and row address decoder 115, by using the CELSRC generator 107-1 and HV generator 107-2.

Incidentally, in the present embodiment, the input/output control circuit 103, logic control circuit 105 and control circuit 106 have been described with respect to their individual functions. However, the input/output control circuit 103, logic control circuit 105 and control circuit 106 may be realized by the same hardware resource.

The address register 108 latches, for example, an address which was supplied from the memory controller 200. Then, the address register 108 converts the latched address to internal physical addresses (a column address and a row address). In addition, the address register 108 supplies the column address to a column buffer 114, and supplies the row address to a row address buffer decoder 116.

The status register 109 is configured to notify various states within the memory chip 100 to the outside. The status register 109 includes a ready/busy register which holds data indicating whether the memory chip 100 is in a ready state or a busy state, and a write status register (not shown) which holds data indicating pass/fail of write.

In the present embodiment, the memory cell array 110 is a planar NAND flash memory. Specifically, the memory cell array 110 includes a plurality of bit lines BL, a plurality of word lines WL, and a source line SL. The memory cell array 110 is composed of a plurality of blocks BLK in which electrically rewritable memory cell transistors (also referred to simply as "memory cells") MT are arranged in a matrix. The memory cell transistor MT includes, for example, a stacked gate including a control gate electrode and a charge accumulation layer (e.g. a floating gate electrode). The memory cell transistor MT stores single-level data or multilevel data in accordance with a variation of the threshold of the transistor, which is determined by a charge amount injected in the charge accumulation layer. The memory cell transistor MT may have a MONOS (Metal-Oxide-Nitride-Oxide-Silicon) structure in which electrons are trapped in a nitride film.

The configuration of the memory cell array 110 is disclosed in U.S. patent application Ser. No. 12/397,711 filed Mar. 3, 2009 and entitled "SEMICONDUCTOR MEMORY DEVICE HAVING PLURALITY OF TYPES OF MEMORIES INTEGRATED ON ONE CHIP". In addition, the configuration thereof is disclosed in U.S. patent application Ser. No. 13/451,185 filed Apr. 19, 2012 and entitled "SEMICONDUCTOR MEMORY DEVICE INCLUDING STACKED GATE HAVING CHARGE ACCUMULATION LAYER AND CONTROL GATE AND METHOD OF WRITING DATA TO SEMICONDUCTOR MEMORY DEVICE", in U.S. patent application Ser. No. 12/405,626 filed Mar. 17, 2009 and entitled "NONVOLATILE SEMICONDUCTOR MEMORY ELEMENT, NONVOLATILE SEMICONDUCTOR MEMORY, AND METHOD FOR OPERATING NONVOLATILE SEMICONDUCTOR MEMORY ELEMENT", and in U.S. patent application Ser. No. 09/956,986 filed Sep. 21, 2001 and entitled "NONVOLATILE SEMICONDUCTOR MEMORY DEVICE HAVING ELEMENT ISOLATING REGION OF TRENCH TYPE AND METHOD OF MANUFACTURING THE SAME". The entire descriptions of these patent applications are incorporated by reference herein.

At a time of a data read operation, the sense circuit 111 senses data which was read to a bit line from the memory cell transistor MT.

The data register 112 is composed of an SRAM or the like. The data register 112 stores data which was supplied from the memory controller 200, or a verify result which was detected by the sense circuit 111.

The column decoder 113 decodes a column address signal which is stored in the column buffer 114, and outputs a select signal for selecting any one of the bit lines BL to the sense circuit 111.

The column buffer 114 temporarily stores a column address signal which is input from the address register 108.

The row address decoder 115 decodes a row address signal which is input via the row address buffer decoder 116. Then, the row address decoder 115 selects and drives a word line WL and a select gate line SGD, SGS of the memory cell array 110.

The row address buffer decoder 116 temporarily stores a row address signal which is input from the address register 108.

<1-1-4> Memory Cell Array 110 and Peripheral Circuits Thereof

Referring to FIG. 2, the memory cell array 110 and peripheral circuits thereof are described.

Incidentally, respective control signals illustrated in FIG. 2 are supplied from, for example, the control circuit 106.

The memory cell array 110 includes a plurality of bit lines BL (BL(0)~BL(m)) (m is a natural number). A plurality of NAND strings (also referred to as "string units") SU (SU (0_0)~SU(0_x)) are connected to the bit line BL(0). The other bit lines BL (BL(1)~BL(m)) are configured like the bit line BL(0). The configuration of the NAND string SU will be described later.

The sense circuit 111 includes sense amplifiers 111a (111a(0)~111a(m)) in association with the respective bit lines BL. Specifically, the sense amplifier 111a(0) is connected to one end (first end) of the bit line BL (0). Similarly, the sense amplifiers 111a(1)~111a(m) are connected to first ends of the bit lines BL(1)~BL(m).

The sense circuit 111 includes NMOS transistors 111b (111b(0)~111b(m)) in association with the respective sense amplifiers 111a. One end (first end) of the NMOS transistor 111b(0) is connected to the sense amplifier 111a(0) via a node N1 (SRCGND). Similarly, first ends of the NMOS transistors 111b(1)~111b(m) are connected to the sense amplifiers 111a(1)~111a(m) via nodes N1 (SRCGND). The other end (second end) of the NMOS transistor 111b(0) is connected to a node N2 (CELSRC). Similarly, second ends of the NMOS transistors 111b(1)~111b(m) are connected to the node N2 (CELSRC). A control signal CSGH(0) is input to the gate electrode of the NMOS transistor 111b(0). Similarly, control signals "CSGH(1)" ~"CSGH(m)" are input to the gate electrodes of the NMOS transistors 111b (1)~111b(m). The transistor 111b controls a connection between the sense amplifier 111a and the node N2.

The sense circuit 111 includes NMOS transistors 111c (111c(0)~111c(m)) in association with the respective bit lines BL. One end (first end) of the NMOS transistor 111c(0) is connected to the other end (second end) of the bit line BL(0). Similarly, first ends of the NMOS transistors 111c (1)~111c(m) are connected to second ends of the bit lines BL(1)~BL(m). A second end of the NMOS transistor 111c (0) is connected to the node N2 (CELSRC). Similarly, second ends of the NMOS transistors 111c(1)~111c(m) are connected to the node N2 (CELSRC). A control signal CSGN(0) is input to the gate electrode of the NMOS transistor 111c(0). Similarly, control signals "CSGN(1) "~"CSGN(m)" are input to the gate electrodes of the NMOS transistors 111c(1)~111c(m). The transistor 111c controls a connection between the bit line BL and the node N2.

The CELSRC generator 107-1 includes NMOS transistors 107a, 107b, 107c, 107d and 107e.

The NMOS transistor 107a has a first end to which a voltage "VDDSA" is applied, has a second end connected to a node N3, and has a gate electrode to which a control signal "SVDD" is input.

The NMOS transistor 107b has a first end to which a voltage "Half VDDSA" is applied, has a second end connected to the node N3, and has a gate electrode to which a control signal "SHVDD" is input. In the meantime, the voltage "Half VDDSA" is, for example, a voltage of about half the voltage "VDDSA".

The NMOS transistor 107c has a first end to which a voltage "VSS" (VSS<Half VDDSA<VDDSA) is applied, has a second end connected to the node N3, and has a gate electrode to which a control signal "SVSS" is input.

The NMOS transistor 107d has a first end to which a voltage "VCELSRC" (VSS<Half VDDSA<VCELSRC≤VDDSA) is applied, has a second end connected to the node N3, and has a gate electrode to which a control signal "SVCEL" is input.

The NMOS transistor 107e has a first end connected to the node N3, has a second end connected to the node N2, and has a gate electrode to which a control signal "VDDSRC" is input.

The CELSRC generator 107-1 supplies the voltage "VDDSA", "Half VDDSA" or "VSS" to the node N2, based on the control signal from the control circuit 106.

The CELSRC generator 107-1 may generate the voltage "VDDSA", "Half VDDSA" and "VSS", or may receive them via a VCC pin or VSS pin.

<1-1-5> Sense Amplifier

Referring to FIG. 3, the configuration of the sense amplifier 111a is described. The sense amplifier 111a is provided in association with each of the bit lines BL.

As illustrated in FIG. 3, the sense amplifier 111a includes, for example, NMOS transistors 11a, 11b, 11c, 11d, 11e, 11f, 11h and 11i, and a PMOS transistor 11g.

The transistor 11a has a gate electrode to which a signal "BLS" is applied, has one end connected to the bit line BL, and has the other end connected to a node N4. The transistor 11a is configured to control a connection between the sense amplifier 111a and bit line BL.

The transistor 11b has a gate electrode to which a signal "BLV" is applied, has one end connected to the node N4, and has the other end connected to a node N8.

The transistor 11c has a gate electrode to which a signal "CSG" is applied, has one end connected to the node N8, and has the other end connected to the node N1 (SRCGND).

The transistor 11d is configured to control a precharge potential of the bit line BL at a time of data read. The transistor 11d has one end connected to the node N4, the other end connected to a node N5, and has a gate to which a signal "BLC" is applied.

The transistor 11g is configured to charge the bit line BL, has a gate connected to a node INV, and has one end to which a power supply voltage "VDDSA" is applied.

The transistor 11f is configured to precharge the bit line BL, has a gate to which a signal BLX is applied, has one end connected to the node N5, and has the other end connected to a node N6.

The transistor 11i is configured to charge the node N7 (SEN), has a gate to which a signal "HLL" is applied, has one end connected to the node N7 (SEN), and has the other end connected to the node N6.

The transistor 11h is configured to discharge the node N7 (SEN) at a time of a sense operation, has a gate to which a signal "XXL" is applied, has one end connected to the node N7 (SEN), and has the other end connected to the node N5.

The transistor 11e is configured to fix the bit line BL at a fixed potential, has a gate connected to the node INV, has one end connected to the node N5, and has the other end connected to the node N1 (SRCGND).

The sense amplifier 111a senses the data of the memory cell transistor MT, based on the potential of the node N7 (SEN).

<1-1-6> Configuration of Memory Cell Array

Figure 4:
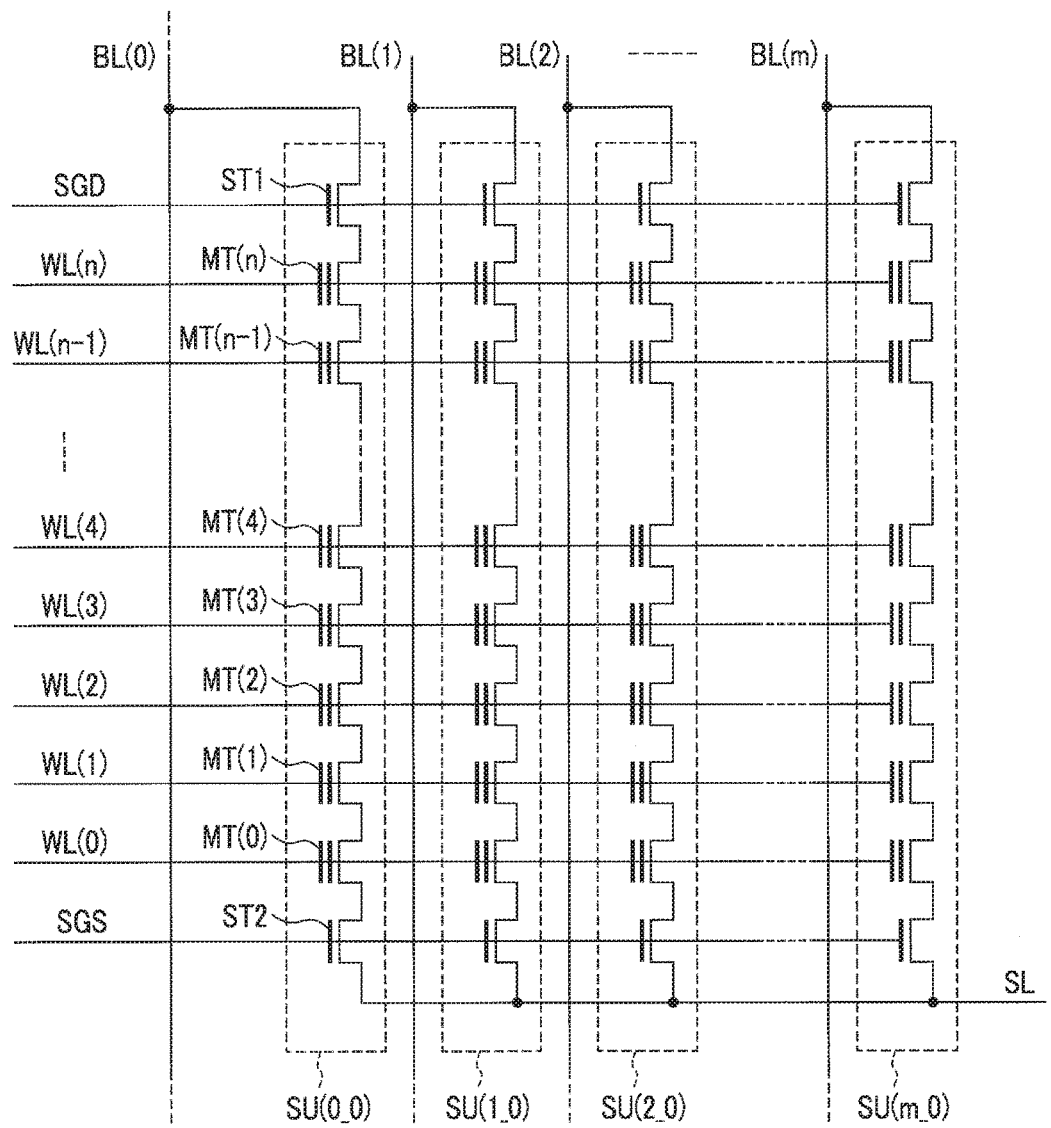
FIG. 4 is a circuit diagram illustrating a part of the memory cell array of the semiconductor memory device according to the first embodiment.

Next, referring to FIG. 4, one block BLK of the memory cell array 110 is described.

As illustrated in the Figure, the block BLK includes a plurality of NAND strings SU (SU(0)~SU(m)). Each of the NAND strings SU includes an n-number (n is a natural number) of memory cell transistors MT(0) to MT(n) and select transistors ST1, ST2. Hereinafter, for the purpose of simple description, when the memory cell transistors MT(0) to MT(n) are not distinguished, the memory transistors MT(0) to MT(n) are referred to simply as "memory transistors MT" in some cases. The memory transistor MT includes a multilayer gate structure including a charge accumulation layer (e.g. floating gate) which is formed on a semiconductor substrate via a gate insulation film, and a control gate which is formed on the charge accumulation layer via an inter-gate insulation film. Neighboring ones of the memory cell transistors MT share a source and a drain. In addition, the memory cell transistors MT are disposed such that their current paths are connected in series between the select transistors ST1 and ST2. The drain on one end side of the series-connected memory cell transistors MT is connected to the source of the select transistor ST1, and the source on the other end side thereof is connected to the drain of the select transistor ST2. Specifically, the NAND string includes two select transistors ST1 and ST2, and a memory cell group including memory cell transistors MT which are connected in series between the select transistors ST1 and ST2.

The control gates of memory cell transistors MT, which are disposed on the same row, are commonly connected to any one of word lines WL0 to WLn, and the gates of select transistors ST1, ST2, which are disposed on the same row, are commonly connected to the select gate line SGD, SGS. In addition, the drains of select transistors ST1, which are disposed on the same column in the memory cell array 110, are commonly connected to any one of bit lines BL0 to BLm. The sources of the select transistors ST2 are commonly connected to a source line SL. Incidentally, both select transistors ST1, ST2 are not necessarily needed, and only one of them may be provided if a NAND cell can be selected.

<1-1-7> Cross Section of Memory Cell Array

Next, referring to FIG. 5, a cross-sectional configuration of the NAND string with the above-described configuration is described. FIG. 5 is a cross-sectional view along a bit line direction of the NAND string. As illustrated in the Figure, an n-type well region 21 is provided on a surface region of a p-type semiconductor substrate (e.g. silicon substrate) 20. A p-type well region 22 is provided on a surface region of the n-type well region 21. A gate insulation film 23 is provided on the p-type well region 22. Gate structures of memory cell transistors MT and select transistors ST1 and ST2 are provided on the gate insulation film 23. The gate structure of the select transistor ST1, ST2 includes a conductive layer 24 provided on the gate insulation film 23, and a conductive layer 26 provided on the conductive layer 24. The gate structure of the memory cell transistor MT includes a conductive layer 24 provided on the gate insulation film 23, an inter-gate insulation film 25 provided on the conductive layer 24, and a conductive layer 26 provided on the inter-gate insulation film 25. It should suffice if the conductive layer 24 functions as a memory layer (charge accumulation layer), and the conductive layer 24 may be a metal, poly-crystalline silicon, or a charge trap-type material. It should suffice if the conductive layer 26 functions as a control gate electrode of a transistor, and the conductive layer 26 may be a metal, or polycrystalline silicon. The inter-gate insulation film 25 is formed of, for example, a silicon oxide film, or an ON (oxide-nitride) film, an NO (nitride-oxide) film or an ONO (oxide-nitride-oxide) film which is a multilayer structure including a silicon oxide film and a silicon nitride film. Incidentally, for the purpose of simplicity, the well region is also described simply as "well". In addition, in some cases, the p-type semiconductor substrate 20, n-type well region 21 and p-type well region 22 are described simply as "semiconductor substrate".

In the memory cell transistor MT, the conductive layer 24 functions as a charge accumulation layer (FG: floating gate). On the other hand, the conductive layer 26 functions as a control gate electrode (word line WL). In the select transistor ST1, ST2, the conductive layer 24, 26 functions as the select gate line SGS, SGD. An n-type impurity diffusion layer 27 is formed in a surface of the p-type well region 22, which is located between the gate structures. The impurity diffusion layer 27 is shared by neighboring transistors, and functions as a source (S) or a drain (D).

An interlayer insulation layer 28 is formed on the p-type well region 22 in a manner to cover the gate structures of the memory cell transistors MT and select transistors ST1 and ST2. A contact plug CP1, which reaches the impurity diffusion layer (source) 27 of the source-side select transistor ST2, is formed in the interlayer insulation layer 28. In addition, a metal wiring layer 29, which is connected to the contact plug CP1, is formed on the interlayer insulation layer 28. The metal wiring layer 29 functions as the source line SL. Furthermore, a contact plug CP2, which reaches the impurity diffusion layer (drain) 27 of the drain-side select transistor ST1, is formed in the interlayer insulation layer 28. In addition, a metal wiring layer 30, which is connected to the contact plug CP2, is formed on the interlayer insulation layer 28.

An interlayer insulation layer 31 is formed on the interlayer insulation layer 28 in a manner to cover the metal wiring layers 29 and 30. In addition, a contact plug CP3, which reaches the metal wiring layer 30, is formed in the interlayer insulation layer 31. A metal wiring layer 32, which is commonly connected to a plurality of contact plugs CP3, is formed on the interlayer insulation layer 31. The metal wiring layer 32 functions as the bit line BL.

<1-2> Data Write Operation According to the First Embodiment

Figure 6:
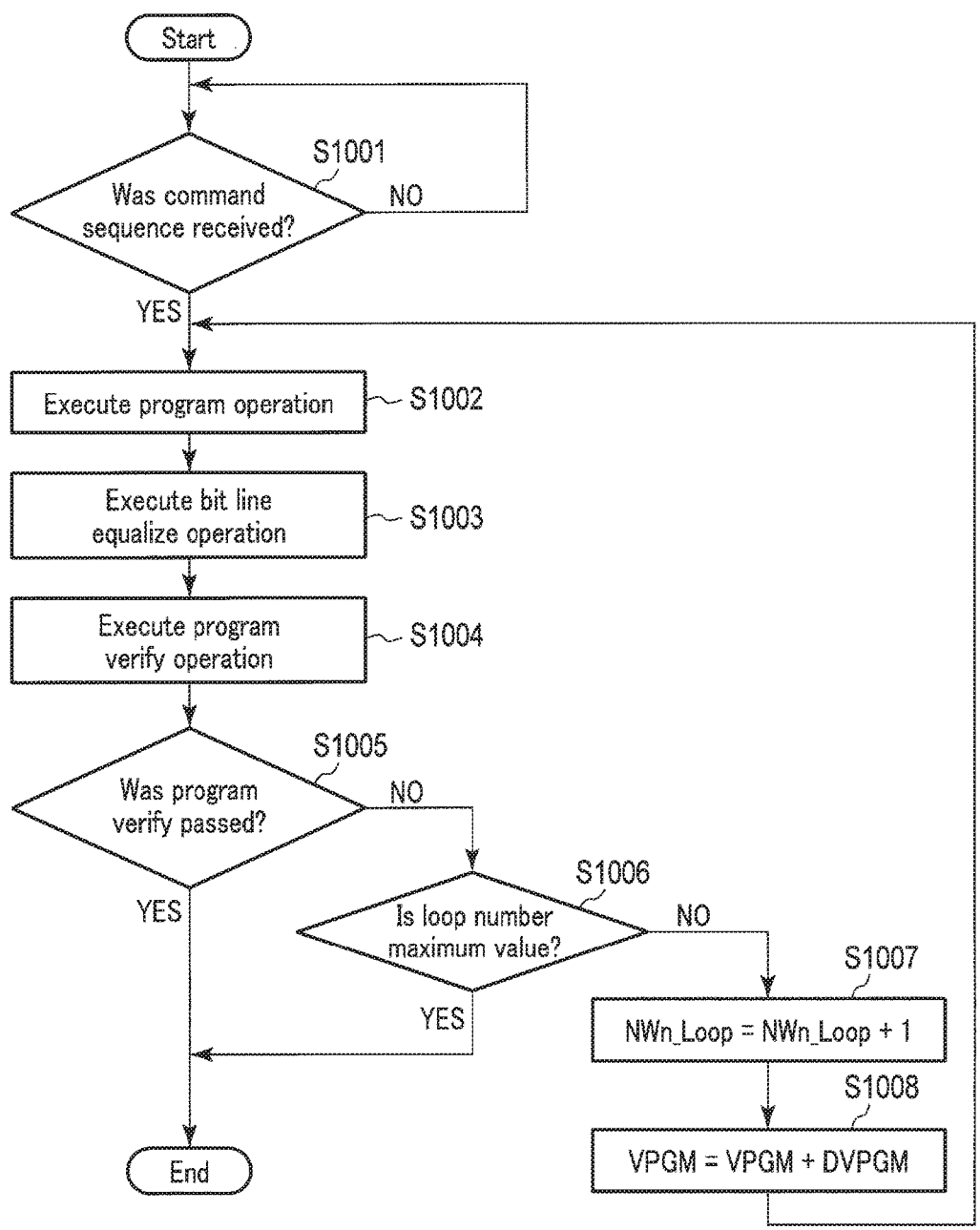
FIG. 6 is a flowchart illustrating a write operation of the semiconductor memory device according to the first embodiment.

Next, referring to a flowchart of FIG. 6, a data write operation (an operation including a program operation and a program verify operation) of the semiconductor memory device according to the present embodiment is described. Incidentally, the process to be described below is mainly executed by the control of the control circuit 106.

[S1001]

The control circuit 106 determines whether a program command, a block address, a page address and a program start command have been received from the memory controller 200. Incidentally, hereinafter, for the purpose of simple description, the program command, address, data and program start command may comprehensively be referred to as "command sequence" in some cases.

[S1002]

If the control circuit 106 determines that the command sequence has been received (step S1001, YES), the control circuit 106 stores the data of the received page in the data register 112. Then, the control circuit 106 starts a program operation.

Operational waveforms at a time of a program operation will be described below. Here, for the purpose of simple description, attention is paid to the operation of a selected block.

Figure 7:
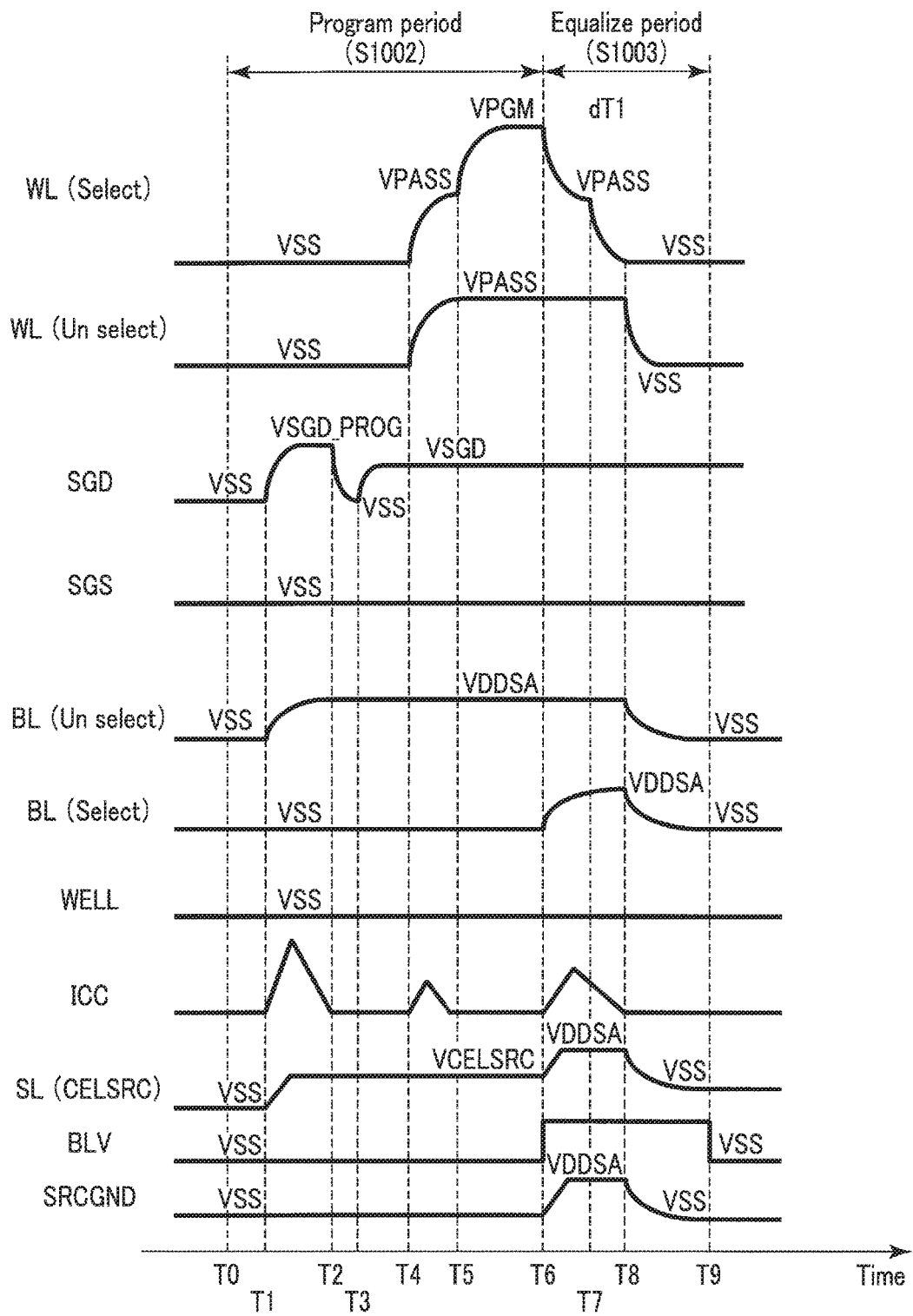
FIG. 7 is a waveform diagram illustrating the write operation of the semiconductor memory device according to the first embodiment.

As illustrated in FIG. 7, at time instant T0 to time instant T1, the control circuit 106 sets at voltage "VSS" the voltages of the selected word line WL, unselected word line WL, select gate line SGD, select gate line SGS, selected bit line BL, unselected bit line BL, source line SL and the well.

At time instant T1 to time instant T2, the control circuit 106 raises the voltage of a signal SGD from voltage "VSS" to voltage "VSGD_PROG" (VSS<VDDSA<VSGD_PROG). Thereby, a voltage is transferred from the bit line BL to an unselected NAND string. In addition, the voltage "VSGD_PROG" is about 4 to 5 V.

Besides, based on a signal from the control circuit 106, the sense amplifier 111 charges the voltage of the unselected bit line BL from voltage "VSS" to voltage "VDDSA" via the transistor 11g. In addition, the control circuit 106 raises the voltage of the source line SL (CELSRC) from voltage "VSS" to voltage "VCELSRC" (VSS<VCELSRC≤VDDSA<VSGD_PRG). Thereby, it becomes possible to suppress, by the substrate effect of the select gate SGS, a boost leak which leaks to the source line SL (CELSRC) while applying voltage "VPGM" to the selected word line WL, voltage "VPASS" to the unselected word line WL, and "VDDSA" to the bit line BL.

At time instant T1 to time instant T2, in order to charge the source line SL, the CELSRC generator 107-1 supplies voltage "VCELSRC" to the node N2 (CELSRC) (see FIG. 2). Thus, the potential of the node N2 increases, as illustrated in FIG. 7.

At time instant T1 to time instant T2, in order to charge the unselected bit line BL, power is supplied from the outside to the memory chip 100 via the VCC pin. Thus, as illustrated in FIG. 7, at time instant T1 to time instant T2, the current value ICC at the VCC pin increases.

At time instant T2 to time instant T3, the control circuit 106 lowers the voltage of the signal SGD from the voltage "VSGD_PRG" to voltage "VSS". Subsequently, at time instant T3 to time instant T4, the control circuit 106 sets the voltage of the signal SGD at voltage "VSGD" (VSS<VSGD<VCELSRC≤VDDSA<VSGD_PROG). The voltage "VSGD" is a voltage which sets the select transistor ST1, which is connected to the selected bit line BL, in the ON state, and sets the select transistor ST1, which is connected to the unselected bit line BL, in the OFF state. The channel of the unselected NAND string and the unselected bit line have been charged up to a predetermined voltage, and, even if the voltage of the signal SGD is set at voltage "VSGD", the select transistor ST1 does not enter the ON state. Since the select transistor ST1 is in the OFF state, the unselected NAND string enters the floating state and the channel potential thereof is maintained. Thereby, the selected NAND string is electrically connected to the bit line BL and source line.

Here, the ON state means that the source and drain of a transistor are electrically connected via the channel of the transistor. In addition, the OFF state means that the source and drain of a transistor are not electrically connected. Even in the OFF state, there is a case in which a leak current or the like flows between the source and drain. This case is treated not as the ON state, but as the OFF state.

At time instant T4 to time instant T5, the control circuit 106 raises the voltages, which are applied to the selected word line WL and unselected word line WL, from voltage "VSS" to voltage "VPASS" (VSS<VSGD< VCELSRC≤VDDSA<VSGD_PROG<VPASS). The voltage "VPASS" is, for example, about 5 to 10 V. The voltage "VPASS" is a voltage which keeps the memory cell transistor MT in the ON state regardless of the threshold of the memory cell transistor MT at a time of write, and prevents erroneous write to the unselected memory cell transistor MT.

At time instant T4 to time instant T5, in order to apply the voltage "VPASS" to the selected word line WL and unselected word line WL, power is supplied from the outside to the memory chip 100 via the VCC pin. Thus, as illustrated in FIG. 7, at time instant T4 to time instant T5, the current value ICC at the VCC pin increases.

At time instant T5 to time instant T6, the control circuit 106 raises the voltage, which is applied to the selected word line WL_SEL to voltage "VPGM" (VSS< VSGD<VCELSRC≤VDDSA<VSGD_PROG<VPASS< VPGM). The voltage "VPGM" is, for example, 10 to 25 V.

A description is given of a selected memory cell transistor MT at a time of program.

Channel regions CHA are formed in unselected memory cell transistors MT to which the voltage "VPASS" is applied, and in a selected memory cell transistor MT to which the voltage "VPGM" is applied. Since the selected bit line BL is at voltage "VSS", the voltage "VSS" is applied to the channel of the selected memory cell transistor MT. At this time, the program voltage "VPGM" is applied between the control gate electrode (conductive layer) 26 and the well 22. Thereby, a tunnel current by a high electric field occurs, and electrons are injected from the channel region CHA into the charge accumulation layer (conductive layer) 24 via the gate insulation film 23. In this manner, a program operation is executed on the selected memory cell transistor MT. Thus, the data stored in the data register 112 is programmed to the memory cell array 110. In addition, since channel boost is executed on the unselected NAND string, no charge is injected in the charge accumulation layer of the memory cell transistor MT. Thereby, the program operation (step S1002) is finished.

[S1003]

After step S1002, the control circuit 106 executes an equalize operation of bit lines. In the memory chip 100 according to the present embodiment, while a selected bit line is being charged, the selected bit line and an unselected bit line are short-circuited, thereby equaling the bit lines BL. In this embodiment, the equalize operation means an operation of connecting bit lines, which belong to a certain block, to one node N2. The equalize operation of bit lines in step S1003 is performed for a program verify operation of step S1004.

The control circuit 106 starts the equalize operation while applying voltage "VDDSA" to the node N2. Thereby, even if the selected bit line, the potential of which is "VSS", and the unselected bit line are connected, the voltage of the unselected bit line is kept at "VDDSA". Thus, the channel boost of the unselected NAND string is maintained.

Hence, even when the voltage of the selected word line has not completely lowered to "VPASS", erroneous write is not executed to the memory cell transistor which is connected to the unselected bit line.

In the present embodiment, by charging the selected bit line, a voltage that is necessary for program is not applied to the unselected memory cell transistor.

Specifically, at time instant T6 to time instant T7 shown in FIG. 7, the control circuit 106 lowers the voltage, which is applied to the selected word line WL, from voltage "VPGM" to voltage "VPASS".

In addition, at time instant T6 to time instant T7, the control circuit 106 sets the signals BLS, BLV, CSG, CSGH and CSGN at "H" level, and sets the signal BLC at "L" level. Thereby, the bit line BL is connected to the node N2 via the transistors 11a, 11b, 11c, 111b and 111c.

Besides, at time instant T6 to time instant T7, based on the control of the control circuit 106, the boost circuit 107 supplies voltage "VDDSA" to the node N2. Specifically, the control circuit 106 sets the transistors 107a and 107d in the ON state.

Thereby, the unselected bit line is kept at voltage "VDDSA", and the selected bit line is charged to voltage "VDDSA".

At time instant T6 to time instant T7, in order to apply voltage "VDDSA" to the node N2, power is supplied from the outside to the memory chip 100 via the VCC pin. Thus, as illustrated in FIG. 7, at time instant T6 to time instant T7, the current value ICC at the VCC pin increases.

At time instant T6 to time instant T7, in order to charge the selected bit line BL, the boost circuit (HV generator) 107 supplies voltage "VDDSA" to the node N2 (see FIG. 2). Thus, as illustrated in FIG. 7, the potential of the node N2 (CELSRC) increases.

In addition, since the node N1 (SRCGND) is connected to the node N2, the potential increases.

At time instant T7 to time instant T8 shown in FIG. 7, the control circuit 106 discharges the voltage, which is applied to the selected word line WL, from the voltage "VPASS" to voltage "VSS".

At time instant T8 to time instant T9, the control circuit 106 discharges the voltage, which is applied to the unselected word line WL, from the voltage "VPASS" to voltage "VSS". In addition, the control circuit 106 lowers the voltage of the source line SL from voltage "VCELSRC" to voltage "VSS".

Besides, if the selected bit line BL is charged to "VDDSA" and the potential of the selected word line WL lowers to "VPASS" or less, the control circuit 106 sets the node N2 at "VSS". Specifically, the control circuit 106 sets the transistors 107c and 107d in the ON state. Thereby, both the selected bit line and unselected bit line are set at "VSS", and the equalize operation (step S1003) is finished. Incidentally, the time that is needed from the beginning to end of the equalize operation is dT1.

Referring back to FIG. 6, the process subsequent to the equalize operation is described.

[S1004]

After the end of step S1003, the control circuit 106 executes a program verify operation. The control circuit 106 executes a threshold determination operation of the memory cell transistor MT by finding a threshold voltage at which the memory cell transistor MT enters the ON state.

[S1005]

The control circuit 106 determines whether the program verify was passed. If the program verify in the selected page is passed (step S1005, YES), the write operation for this page is completed.

[S1006]

If the control circuit 106 determines that the program verify in the selected page is not passed (step S1005, NO), the control circuit 106 determines whether a loop number NWLn_loop of the program operation on this page has reached a maximum value or not. If the control circuit 106 determines that the loop number NWLn_loop has reached the maximum value (step S1006, YES), the control circuit 106 finishes the write operation on this page.

[S1007]

In step S1006, if the control circuit 106 determines that the loop number NWLn_loop has not reached the maximum value (step S1006, NO), the control circuit 106 updates the loop number NWLn_loop to NWLn_loop+1.

[S1008]

The control circuit 106 increases the program voltage VPGM by DVPGM. Then, using the updated program voltage VPGM, the control circuit 106 repeats the operation of step S1002.

The control circuit 106 repeats the operations of steps S1002 to S1008 until the control circuit 106 determines in step S1005 that the verify operation has been passed, or until the control circuit 106 determines in step S1006 that the loop number NWLn_loop is the maximum value.

<1-3> Advantageous Effects

According to the above-described embodiment, in the memory chip 100, at the time of the equalize operation of bit lines BL, while the connection node is being charged, the selected bit line and the unselected bit line are short-circuited via the connection node. Thereby, the equalize operation, together with the discharge of the program voltage, can be started, without releasing the channel boost of the unselected NAND string.

Here, a description is given of an equalize operation of bit lines of a memory chip according to a comparative example of the present embodiment.

Figure 8:
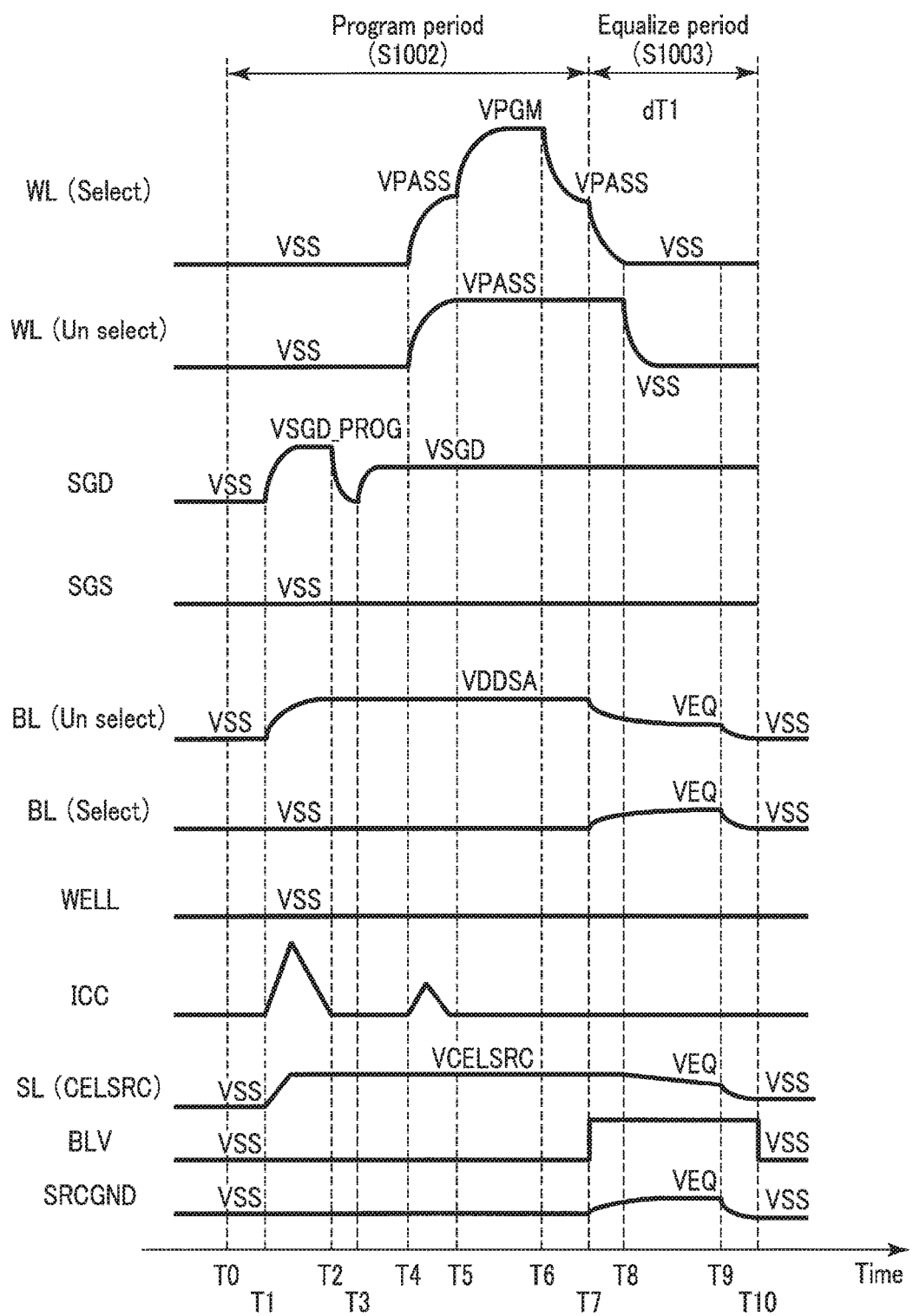
FIG. 8 is a waveform diagram illustrating a write operation of a semiconductor memory device according to a comparative example of the first embodiment.

As illustrated in FIG. 8, in the memory chip according to the comparative example, at the time of the equalize operation of bit lines, the bit lines are not charged. For example, if the bit lines are not charged at time instant t6 and the equalize operation of the bit lines is performed, the potential of the drain of the select transistor ST1 of the unselected NAND string falls and the select transistor ST1 of the unselected NAND string enters the ON state. Consequently, there would be a case in which the channel boost of the unselected NAND string is released. As a result, erroneous write would occur in the unselected NAND string. This being the case, in the memory chip according to the comparative example, the equalize operation of bit lines is started after waiting until the selected word line WL is sufficiently discharged. Thus, the time from the beginning of the program operation to the end of the bit line equalize operation becomes longer than in the case of the present embodiment by a wait time for the discharge of the selected word line WL.

In the meantime, the time dT1, which is needed for the bit line equalize operation in the above-described embodiment, is substantially equal to a time dT1 which is needed for the bit line equalize operation in the comparative example. In the above-described embodiment, compared to the comparative example, the time from the beginning of the program operation to the end of the bit line equalize operation is shorter by the time instant t6 to time instant t7.

As has been described above, according to the above-described embodiment, the equalize operation of bit lines can be started without waiting for the discharge of the selected word line at the time of the program operation. Therefore, it is possible to suppress an increase in time from the beginning of the program operation to the end of the bit line equalize operation. Thereby, the speed of the write operation can be increased. As a result, a high-quality semiconductor memory device can be provided.

<1-4> Modification 1 of the First Embodiment

Next, a modification of the first embodiment is described. A description of the same parts as in the first embodiment is omitted.

Referring to FIG. 9, Modification 1 of the first embodiment is described. In Modification 1 of the first embodiment, a configuration of the sense amplifier 111a is described. The sense amplifier 111a according to Modification 1 of the first embodiment differs from the sense amplifier 111a of the first embodiment.

As illustrated in FIG. 9, the sense amplifier 111a includes NMOS transistors 11a, 11d, 11f, 11h, 11i, 11j and 11k, and a PMOS transistor 11g.

The transistor 11j has a gate electrode to which a signal "BLV" is applied, has one end connected to the node N4, and has the other end connected to a node N9.

The transistor 11k has a gate electrode to which a signal "CSG" is applied, has one end connected to the node N9, and has the other end connected to the node N1 (SRCGND).

In the first embodiment, at the time of executing the bit line equalize operation, the control circuit 106 executes control to set the transistor 11d in the OFF state and to set the transistors 11a, 11b and 11c in the ON state.

However, in Modification 1 of the first embodiment, at the time of executing the bit line equalize operation, the control circuit 106 executes control to set the transistors 11d, 11j and 11k in the ON state.

Specifically, in Modification 1 of the first embodiment, the transistor 11d, which is set in the OFF state in the first embodiment, is set in the ON state. Thereby, the sense amplifier 111a according to Modification 1 of the first embodiment, can be applied to the write operation of the first embodiment.

Although the sense amplifier 111a, which is different from the sense amplifier 111a of the first embodiment, has been described above, the configuration of the sense amplifier can properly be altered, aside from the sense amplifier 111a of the modification of the first embodiment 1.

<2> Second Embodiment

Next, a second embodiment is described. A description of the same parts as in the first embodiment is omitted. In the second embodiment, a description is given of a case in which the charging time of the bit line at the time of the bit line equalize operation is shortened.

<2-1> Data Write Operation According to the Second Embodiment

A data write operation (an operation including a program operation and a program verify operation) of the semiconductor memory device according to the present embodiment is described. Incidentally, the process to be described below is mainly executed by the control of the control circuit 106. Hereinafter, of the operation illustrated in FIG. 6, step S1003, which is different in operation from the first embodiment, is described. The other operation is the same as described in the first embodiment.

[S1003]

In the memory chip 100 according to the present embodiment, the equalize operation is started while voltage "VDDSA" is being applied to the node N2. Thereby, the voltage of the unselected bit line is kept at "VDDSA" until at least the voltage of the selected word line WL falls to "VPASS". Thus, the release of the channel boost of the unselected NAND string can be suppressed.

In addition, in the memory chip 100, at a time point when the voltage of the selected word line WL has fallen to "VPASS", the voltage that is applied to the node N2 is changed from voltage "VDDSA" to voltage "Half VDDSA".

Figure 10:
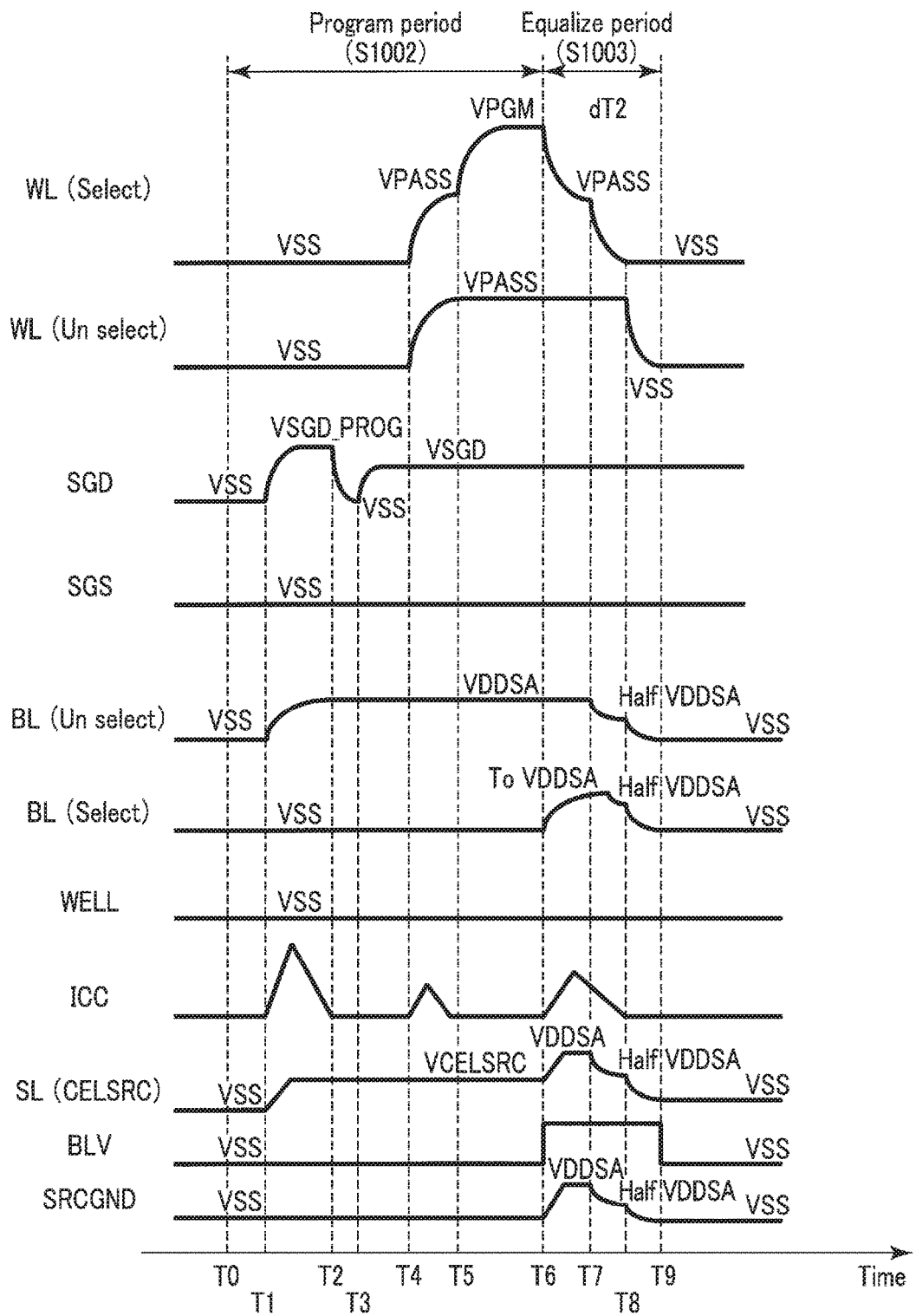
FIG. 10 is a waveform diagram illustrating a write operation of a semiconductor memory device according to a second embodiment.

Specifically, at time instant T6 to time instant T7 shown in FIG. 10, the control circuit 106 lowers the voltage, which is applied to the selected word line WL, from voltage "VPGM" to voltage "VPASS".

In addition, at time instant T6, the control circuit 106 sets the signals BLS, BLV, CSG, CSGH and CSGN at "H" level, and sets the signal BLC at "L" level. Thereby, the bit line BL is connected to the node N2 via the transistors 11a, 11b, 11c, and 111b.

Besides, at time instant T6, the boost circuit 107 supplies voltage "VDDSA" to the node N2. Specifically, the control circuit 106 sets the transistors 107a and 107d in the ON state.

Thereby, the unselected bit line is kept at voltage "VDDSA", and the selected bit line is charged to voltage "VDDSA".

At time instant T6 to time instant T7, in order to apply voltage "VDDSA" to the node N2, power is supplied from the outside to the memory chip 100 via the VCC pin. Thus, as illustrated in FIG. 10, at time instant T6 to time instant T7, the current value ICC at the VCC pin increases.

At time instant T6 to time instant T7, in order to charge the selected bit line BL, the boost circuit (HV generator) 107 supplies voltage "VDDSA" to the node N2 (see FIG. 2). Thus, as illustrated in FIG. 10, the potential of the node N2 (CELSRC) increases.

At time instant T7 to time instant T8, the control circuit 106 discharges the voltage of the selected word line WL from the voltage "VPASS" to voltage "VSS".

If the potential of the selected word line WL lowers to "VPASS", the boost circuit 107 switches, based on the control of the control circuit 106, the voltage that is applied to the node N2 from voltage "VDDSA" to "Half VDDSA". Specifically, the control circuit 106 sets the transistors 107b and 107d in the ON state.

At time instant T8, if the potential of the node N2 lowers to "Half VDDSA", the boost circuit 107 discharges the potential of node N2 to "VSS", based on the control of the control circuit 106. Specifically, the control circuit 106 sets the transistors 107c and 107d in the ON state.

<2-2> Advantageous Effects

According to the above-described embodiment, the potential of the unselected bit line is kept at "VDDSA" until the potential of the selected word line is discharged to "VPASS". In addition, if the potential of the selected word line is discharged to "VPASS", the voltage that is applied to the node N2 is switched.

Thereby, like the first embodiment, while erroneous write is suppressed, a time dT2 (dT2<dT1), which is needed for the bit line equalize operation, can be shortened.

<3> Third Embodiment

Next, a third embodiment is described. A description of the same parts as in the first embodiment is omitted. The third embodiment differs from the first embodiment with respect to the operation relating to the discharge of voltage "VPGM" and the charging of the well.

<3-1> Data Write Operation According to the Third Embodiment

A data write operation (an operation including a program operation and a program verify operation) of the semiconductor memory device according to the present embodiment is described. Incidentally, the process to be described below is mainly executed by the control of the control circuit 106. Hereinafter, of the operation illustrated in FIG. 6, step S1003, which is different in operation from the first embodiment, is described. The other operation is the same as described in the first embodiment.

[S1003]

After the end of step S1002, the control circuit 106 executes an equalize operation of bit lines.

The control circuit 106 starts the equalize operation while applying voltage "VDDSA" to the well.

In the present embodiment, by applying the voltage "VDDSA" to the well, the equalize operation and a de-trap operation are executed at the same time.

Figure 11:
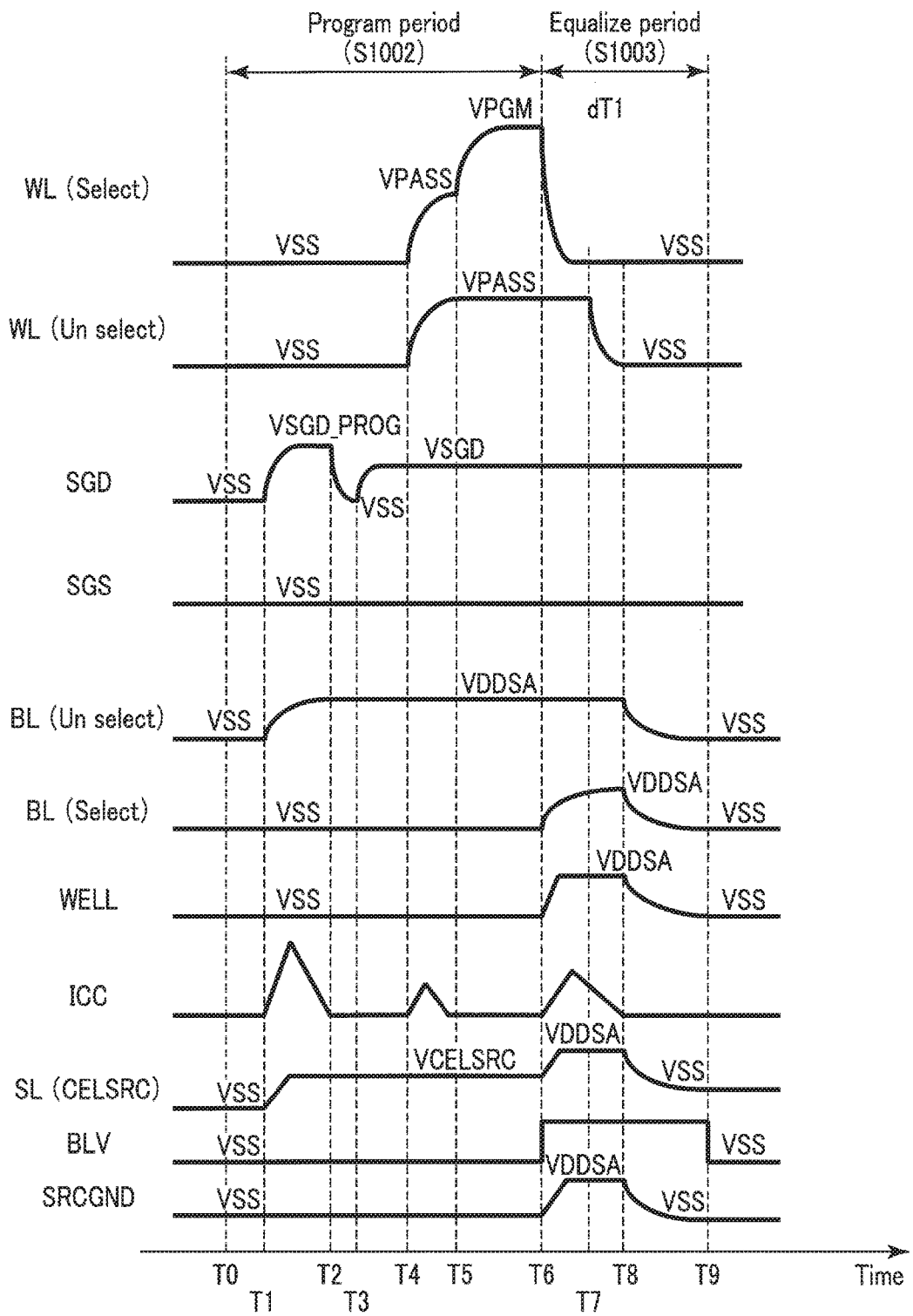
FIG. 11 is a waveform diagram illustrating a write operation of a semiconductor memory device according to a third embodiment.

Specifically, at time instant T6 to time instant T7 shown in FIG. 11, the control circuit 106 lowers the voltage, which is applied to the selected word line WL, from voltage "VPGM" to voltage "VSS".

At time instant T6 to time instant T7, the control circuit 106 raises the voltage, which is applied to the well, from voltage "VSS" to voltage "VDDSA".

In addition, at time instant T6 to time instant T7, the control circuit 106 sets the signals BLS, BLV, CSG, CSGH and CSGN at "H" level, and sets the signal BLC at "L" level. Thereby, the bit line BL is connected to the node N2 via the transistors 11a, 11b, 11c, 111b and 111c.

Besides, at time instant T6 to time instant T7, based on the control of the control circuit 106, the boost circuit 107 supplies voltage "VDDSA" to the node N2. Specifically, the control circuit 106 sets the transistors 107a and 107d in the ON state.

Thereby, the unselected bit line is kept at voltage "VDDSA", and the selected bit line is charged to voltage "VDDSA".

In the meantime, at a time point when the program operation is completed, there is a case in which electrons 23a are trapped in the gate insulation film 23 of the selected memory cell transistor MT. The threshold of the memory cell transistor MT varies depending on the number of electrons which are held in the charge accumulation layer (conductive layer) 24. If program verify is executed in such a state, the threshold is determined based on the electrons held in the charge accumulation layer (conductive layer) 24 and gate insulation film 23. However, the electrons 23a trapped in the gate insulation film 23 tend to be more easily de-trapped than the electrons held in the charge accumulation layer (conductive layer) 24. Such electrons 23a would move even with the application of a weak voltage that is applied when the memory cell array 110 is operated. As a result, the threshold of the memory cell transistor MT would vary, leading to degradation in data reliability. Consequently, it is possible that the threshold of the memory cell transistor MT varies at a time of program verify and at a time of read. It is thus desirable to de-trap the electrons 23a at a time of program verify.

At time instant T6 to time instant T7, the control circuit 106 applies voltage "VDDSA" to the well. Thus, as illustrated in FIG. 12, an electric field occurs between the gate insulation film 23 of the selected memory cell transistor MT and the well 22. This electric field is an electric field of an opposite polarity (opposite direction) to the electric field that is applied between the control gate electrode 26 and well 22 at a time of write. By this electric field, the electrons 23a in the gate insulation film 23 are released (de-trapped) to the well 12 (see arrows in the Figure).

Thereby, while the equalize operation of bit lines BL is being executed, the number of electrons trapped in the gate insulation film 23 can be decreased.

At time instant T7 to time instant T8 shown in FIG. 11, the control circuit 106 discharges the voltage, which is applied to the selected word line WL, from voltage "VPASS" to voltage "VSS".

At time instant T8 to time instant T9, the control circuit 106 discharges the voltage, which is applied to the unselected word line WL, from voltage "VPASS" to voltage "VSS". In addition, the control circuit 106 lowers the voltage of the source line SL from "VDDSA" to voltage "VSS". Furthermore, the control circuit 106 lowers the voltage of the well from voltage "VDDSA" to voltage "VSS".

Besides, if the selected bit line BL is charged to "VDDSA" and the potential of the selected word line WL falls to "VPASS" or less, the control circuit 106 sets the node N2 at "VSS". Specifically, the control circuit 106 sets the transistors 107c and 107d in the ON state. Thereby, both the selected bit line and unselected bit line are set at "VSS", and the equalize operation (step S1003) is finished.

<3-2> Advantageous Effects

According to the above-described embodiment, by applying the voltage "VDDSA" to the well, the equalize operation and the de-trap operation are executed at the same time. Thereby, even if the discharge of the selected word line WL is executed at time instant T6 to time instant T7, a negative voltage, as viewed from the memory cell transistor, is applied to the well. Thus, erroneous write can be suppressed, and furthermore the de-trap operation can be executed. Therefore, while the de-trap operation is executed, the same advantageous effects as in the first embodiment can be obtained.

<4> Additional Descriptions

In the meantime, Modification 1 of the first embodiment is applicable to the second embodiment.

In the above-described embodiments and modification, the case was described in which the voltage "VDDSA" is applied to the node N2 at the time of the bit line equalize operation. However, the embodiments and modification are not limited to this case. Specifically, any voltage, by which the select transistor ST1 of the unselected NAND string can be kept in the cutoff state, is applicable to the above-described embodiments and modification. In addition, the boost circuit 107 may further include a transistor which can supply the above-described voltage.

The NMOS transistors, which were described in the above-described embodiments and modification, may be replaced with PMOS transistors. In this case, a control signal becomes an inverted signal of the control signal which is input to the NMOS transistor. In addition, the PMOS transistors, which were described in the above-described embodiments and modification, may be replaced with NMOS transistors. In this case, a control signal becomes an inverted signal of the control signal which is input to the PMOS transistor.

Furthermore, in the above-described embodiments and modification, the case was described in which a planar type memory is applied as the memory cell array 110. However, even when a memory of a three-dimensional multilayer structure is applied as the memory cell array 110, the same advantageous effects as in the above-described embodiments and modification can be obtained.

The configuration of the memory cell array 110 is disclosed in U.S. patent application Ser. No. 12/407,403 filed 19 Mar. 2009 and entitled "three dimensional stacked nonvolatile semiconductor memory". In addition, the configuration thereof is disclosed in U.S. patent application Ser. No. 12/406,524 filed 18 Mar. 2009 and entitled "three dimensional stacked nonvolatile semiconductor memory", in U.S. patent application Ser. No. 13/816,799 filed 22 Sep. 2011 and entitled "nonvolatile semiconductor memory device", and in U.S. patent application Ser. No. 12/532,030 filed 23 Mar. 2009 and entitled "semiconductor memory and method for manufacturing the same". The entire descriptions of these patent applications are incorporated by reference herein.

Besides, in each of the embodiments and each of the Modifications:

(1) In the read operation:

A voltage, which is applied to a word line selected in an A level read operation, is, for example, between 0 V and 0.55 V. The voltage is not limited to this, and may be between 0.1 V and 0.24 V, between 0.21 V and 0.31 V, between 0.31 V and 0.4 V, between 0.4 V and 0.5 V, or between 0.5 V and 0.55 V.

A voltage, which is applied to a word line selected in a B level read operation, is, for example, between 1.5 V and 2.3 V. The voltage is not limited to this, and may be between 1.65 V and 1.8 V, between 1.8 V and 1.95 V, between 1.95 V and 2.1 V, or between 2.1 V and 2.3 V.

A voltage, which is applied to a word line selected in a C level read operation, is, for example, between 3.0 V and 4.0 V. The voltage is not limited to this, and may be between 3.0 V and 3.2 V, between 3.2 V and 3.4 V, between 3.4 V and 3.5 V, between 3.5 V and 3.6 V, or between 3.6 V and 4.0 V.

A time (tR) of the read operation may be, for example, between 25 μs and 38 μs, between 38 μs and 70 μs, or between 70 μs and 80 μs.

(2) The write operation includes a program operation and a verify operation, as described above. In the write operation:

A voltage, which is first applied to a word line selected at a time of the program operation, is, for example, between 13.7 V and 14.3 V. The voltage is not limited to this, and may be, for example, between 13.7 V and 14.0 V, or between 14.0 V and 14.6 V.

A voltage, which is first applied to a selected word line at a time of write to an odd-numbered word line, may be made different from a voltage, which is first applied to a selected word line at a time of write to an even-numbered word line.

When an ISPP method (Incremental Step Pulse Program) is adopted for the program operation, a step-up voltage may be, for example, about 0.5 V.

A voltage, which is applied to an unselected word line, may be, for example, between 6.0 V and 7.3 V. This voltage is not limited to this case, and may be, for example, between 7.3 V and 8.4 V, or 6.0 V or less.

A pass voltage, which is applied, may be changed according to whether an unselected word line is an odd-numbered word line or an even-numbered word line.

A time (tProg) of the write operation may be, for example, between 1700 μs and 1800 μs, between 1800 μs and 1900 μs, or between 1900 μs and 2000 μs.

(3) In the erase operation:

A voltage that is first applied to a well, which is formed at an upper portion of the semiconductor substrate and on which the memory cell is disposed, is, for example, between 12 V and 13.6 V. This voltage is not limited to this case, and may be, for example, between 13.6 V and 14.8 V, between 14.8 V and 19.0 V, between 19.0 V and 19.8 V, or between 19.8 V and 21 V.

A time (tErase) of the erase operation may be, for example, between 3000 μs and 4000 μs, between 4000 μs and 5000 μs, or between 4000 μs and 9000 μs.

(4) In the configuration of memory cell:

A charge accumulation layer is disposed on a semiconductor substrate (silicon substrate) via a tunnel insulation film with a film thickness of 4 to 10 nm. This charge accumulation layer may have a multilayer structure including an insulation film of SiN or SiON with a film thickness of 2 to 3 nm, and polysilicon with a film thickness of 3 to 8 nm. In addition, a metal, such as Ru, may be added to the polysilicon. An insulation film is provided on the charge accumulation layer. This insulation film includes, for example, a silicon oxide film with a film thickness of 4 to 10 nm, which is interposed between a lower-layer High-k film with a film thickness of 3 to 10 nm and an upper-layer High-k film with a film thickness of 3 to 10 nm. The High-k film is, for instance, HfO. In addition, the film thickness of the silicon oxide film can be made greater than the film thickness of the High-k film. A control electrode with a film thickness of 30 nm to 70 nm is formed on the insulation film via a material for work function adjustment with a film thickness of 3 to 10 nm. Here, the material for work function adjustment is a metal oxide film such as TaO, or a metal nitride film such as TaN. As the control electrode, W, for instance, is usable.

In addition, an air gap can be formed between memory cells.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory device comprising:
   a first memory cell;
   a second memory cell;
   a first bit line connected to the first memory cell;
   a second bit line connected to the second memory cell;
   a first word line connected to the first memory cell and the second memory cell; and
   a control circuit configured to, at a time of writing data to the first memory cell:
   apply a first voltage to the second bit line,
   apply a second voltage, which is lower than the first voltage, to the first bit line, apply a third voltage, which is higher than the first voltage, to the first word line, after the first word line is charged to the third voltage, apply the second voltage to the first word line, and during a period after the first word line is charged to the third voltage and before the first word line drops to the second voltage, (i) maintain the first voltage on the second bit line, and (ii) apply a fourth voltage, which is higher than the second voltage, to the first bit line.

2. The memory device according to claim 1, wherein the control circuit is configured to apply the fourth voltage to the first bit line until a voltage, which is applied to the first word line, varies from the third voltage to the second voltage.

3. The memory device according to claim 2, wherein the control circuit is configured to vary a potential of the first bit line and a potential of the second bit line from fourth voltage and the first voltage, respectively, to the second voltage, after the voltage, which is applied to the first word line, is varied to the second voltage.

4. The memory device according to claim 3, wherein the control circuit is configured to vary the potential of the first bit line and the potential of the second bit line from fourth voltage and the first voltage, respectively, to the second voltage, when the first bit line and the second bit line have become equal in potential.

5. The memory device according to claim 1, wherein the fourth voltage is the first voltage, or a fifth voltage at which a select transistor belonging to the same string as the second memory cell is capable of maintaining a cutoff state.

6. The memory device according to claim 1, wherein the control circuit is configured to apply the fourth voltage to the first bit line and the first voltage to the second bit line until a voltage which is applied to the first word line varies from the third voltage to a sixth voltage, and to apply, thereafter, at a time of the first word line discharging from the sixth voltage to the second voltage, a seventh voltage, which is higher than the second voltage and is lower than the first voltage, to the first bit line and the second bit line.

7. The memory device according to claim 6, wherein the control circuit is configured to vary a potential of the first bit line and a potential of the second bit line from the seventh voltage to the second voltage, after the voltage, which is applied to the first word line, is varied to the second voltage.

8. The memory device according to claim 7, wherein the control circuit is configured to vary the potential of the first bit line and the potential of the second bit line from the seventh voltage to the second voltage, when the first bit line and the second bit line have become equal in potential.

9. The memory device according to claim 8, wherein the control circuit is configured to determine whether data was written to the first memory cell, after the first bit line and the second bit line are set to the second voltage.

10. The memory device according to claim 6, wherein the sixth voltage is a voltage which is capable of turning on the first and second memory cells, without erroneous write being executed to the first and second memory cells.

11. The memory device according to claim 1, wherein the control circuit is configured to vary a potential of the first bit line to the first voltage, during the period after the first word line is charged to the third voltage and before the first word line drops to the second voltage.

12. The memory device according to claim 1, wherein the control circuit is configured to, after the first bit line and the second bit line have become equal in potential, discharge the first and second bit lines to the second voltage.

13. The memory device according to claim 12, wherein the control circuit is configured to, after a potential of the first word line is dropped to the second voltage, discharge the first and second bit lines to the second voltage.

14. The memory device according to claim 1, further comprising:

a transistor configured to connect the first bit line and a node, wherein the control circuit is configured to apply the fourth voltage to the node, and to turn on the transistor, when the control circuit applies the fourth voltage to the first bit line.

15. A method for controlling a memory device, comprising:

applying, when writing data to a first memory cell which is connected to a first bit line and a first word line, a first voltage to a second bit line at a first timing;

applying a second voltage, which is lower than the first voltage, to the first bit line at the first timing;

applying a third voltage, which is higher than the first voltage, to the first word line at a second timing which is later than the first timing;

after the first word line is charged to the third voltage, applying the second voltage to the first word line at a third timing which is later than the second timing; and during a period after the first word line is charged to the third voltage and before the first word line drops to the second voltage, (i) maintaining the first voltage on the second bit line, and (ii) applying a fourth voltage, which is higher than the second voltage, to the first bit line.

16. The method according to claim 15, wherein the applying the fourth voltage to the first bit line includes applying the fourth voltage to the first bit line until a voltage, which is applied to the first word line, varies from the third voltage to the second voltage.

17. The method according to claim 16, further comprising applying the second voltage to the first bit line and the second bit line, after the voltage, which is applied to the first word line, is varied to the second voltage.

18. The method according to claim 17, wherein the applying the second voltage to the first bit line and the second bit line is executed when the first bit line and the second bit line have become equal in potential.

19. The method according to claim 15, wherein the fourth voltage is the first voltage, or a fifth voltage at which a select transistor belonging to the same string as the second memory cell is capable of maintaining a cutoff state.

20. The method according to claim 15, further comprising:

applying the fourth voltage to the first bit line and the first voltage to the second bit line until a voltage, which is applied to the first word line, varies from the third voltage to a sixth voltage; and applying, thereafter, at a time of the first word line discharging from the sixth voltage to the second voltage, a seventh voltage, which is higher than the second voltage and is lower than the first voltage, to the first bit line and the second bit line.

21. The method according to claim 20, further comprising applying the second voltage to the first bit line and the second bit line, after the voltage, which is applied to the first word line, is varied to the second voltage.

22. The method according to claim 21, wherein the applying the second voltage to the first bit line and the second bit line is executed when the first bit line and the second bit line have become equal in potential.

23. The method according to claim 22, further comprising determining whether data was written to the first memory cell, after the first bit line and the second bit line are set to the second voltage.

24. The method according to claim 20, wherein the sixth voltage is a voltage which is capable of turning on the first memory cell, without erroneous write being executed to the first memory cell.

* * * * *